United States Patent
Tu et al.

(10) Patent No.: US 10,418,512 B2
(45) Date of Patent: Sep. 17, 2019

(54) MANUFACTURING METHOD FOR LIGHT EMITTING DIODE CRYSTAL GRAINS USING ADHESIVE LAYER ON AUXILIARY SUBSTRATE TO FILL GAPS BETWEEN LIGHT EMITTING DIODE CRYSTAL GRAINS

(71) Applicant: ADVANCED OPTOELECTRONIC TECHNOLOGY, INC., Hsinchu Hsien (TW)

(72) Inventors: Po-Min Tu, Hsinchu (TW); Tzu-Chien Hung, Hsinchu (TW); Chia-Hui Shen, Hsinchu (TW); Chien-Shiang Huang, Hsinchu (TW); Chien-Chung Peng, Hsinchu (TW); Ya-Wen Lin, Hsinchu (TW); Ching-Hsueh Chiu, Hsinchu (TW)

(73) Assignee: ADVANCED OPTOELECTRONIC TECHNOLOGY INC., Hsinchu Hsien (TW)

( * ) Notice: Subject to any disclaimer, the term of this patent is extended or adjusted under 35 U.S.C. 154(b) by 9 days.

(21) Appl. No.: 15/833,190

(22) Filed: Dec. 6, 2017

(65) Prior Publication Data
US 2019/0140136 A1    May 9, 2019

(30) Foreign Application Priority Data

Nov. 3, 2017  (CN) .......................... 2017 1 1071742

(51) Int. Cl.
| | | |
|---|---|---|
| *H01L 33/00* | (2010.01) | |
| *H01L 33/32* | (2010.01) | |
| *H01L 33/38* | (2010.01) | |

(52) U.S. Cl.
CPC ........ *H01L 33/0079* (2013.01); *H01L 33/007* (2013.01); *H01L 33/0095* (2013.01); *H01L 33/32* (2013.01); *H01L 33/38* (2013.01); *H01L 2933/0016* (2013.01)

(58) Field of Classification Search
CPC . H01L 33/0079; H01L 33/0095; H01L 33/38; H01L 33/007; H01L 33/32
See application file for complete search history.

(56) References Cited

U.S. PATENT DOCUMENTS

| | | | |
|---|---|---|---|
| 2013/0126081 A1* | 5/2013 | Hu ........................... | H01L 24/75 156/249 |
| 2017/0323925 A1* | 11/2017 | Schneider, Jr. ....... | H01L 33/007 |
| 2018/0138071 A1* | 5/2018 | Bower ................ | H01L 21/6835 |
| 2018/0151543 A1* | 5/2018 | Lee ......................... | H01L 33/60 |

* cited by examiner

*Primary Examiner* — Michael Jung
(74) *Attorney, Agent, or Firm* — ScienBiziP, P.C.

(57) ABSTRACT

A method for manufacturing light emitting diode crystal grains includes steps of providing a first substrate; forming a buffer layer on the first substrate; forming a UV blocking layer on buffer layer; and forming a plurality of light emitting diode crystal grains on the buffer layer. The emitting diode crystal grains together form a wafer. An auxiliary substrate is provided and coated with an adhesive layer. The auxiliary substrate is pressed to the wafer, the adhesive layer fills gaps between the light emitting diode crystal grains, and solidifies the adhesive layer. The second surface is irradiated and gasified. The first substrate is thus separated from the UV blocking layer and the adhesive layer is dissolved, thus achieving a plurality of light-emitting diode crystal grains.

16 Claims, 5 Drawing Sheets

MANUFACTURING METHOD FOR LIGHT EMITTING DIODE CRYSTAL GRAINS USING ADHESIVE LAYER ON AUXILIARY SUBSTRATE TO FILL GAPS BETWEEN LIGHT EMITTING DIODE CRYSTAL GRAINS

FIELD

The subject matter herein generally relates to light emitting diode crystal grain, especially, to a manufacturing method for light emitting diode crystal grain.

BACKGROUND

Light-emitting diode crystal grains are generally formed on a substrate by epitaxial growth method. To separate the crystal grains from the substrate, an auxiliary substrate with an adhesive layer is needed, and the auxiliary substrate is pressed to the crystal grains, and the adhesive layer also fills gaps between the light emitting diode crystal grains. A laser beam can irradiate the substrate to separate the crystal grain from the substrate. However, when using a laser beam to irradiate the substrate, the adhesive layer is easily overheated, and the crystal grains are not easily separated from the adhesive layer.

The above-mentioned disadvantages need to be overcome.

BRIEF DESCRIPTION OF THE DRAWINGS

Implementations of the present technology will now be described, by way of example only, with reference to the attached figures.

DETAILED DESCRIPTION

Figure 1:
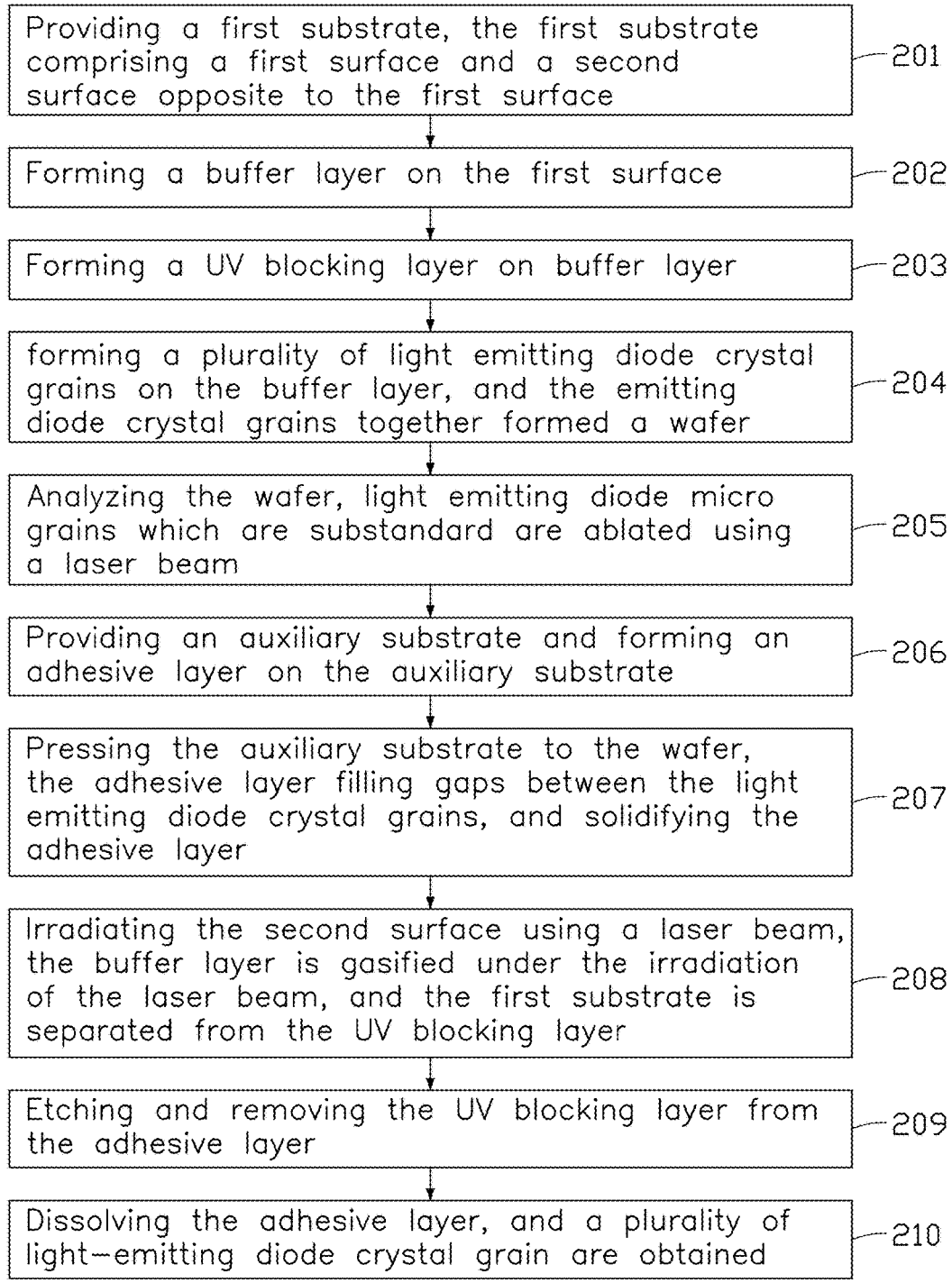
FIG. 1 is a flowchart of a manufacturing method for light emitting diode crystal grain.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIG. 1 illustrates a method for manufacturing light emitting diode crystal grains according to one embodiment. The method is provided by way of example as there are a variety of ways to carry out the method. The method can begin at block 201.

Figure 2:
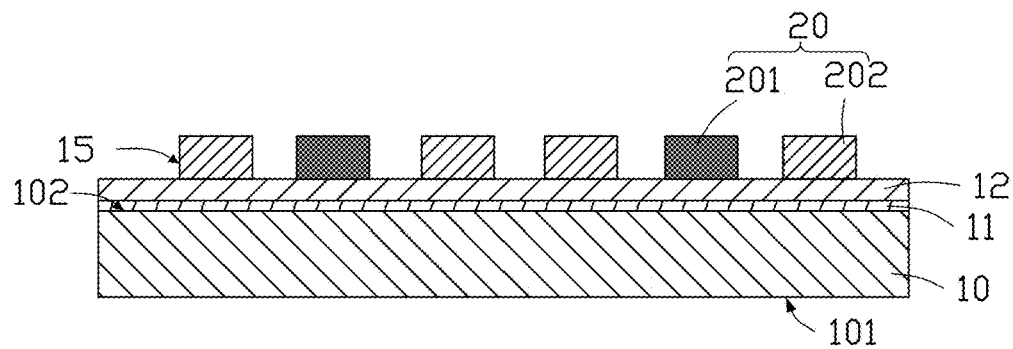
FIG. 2 is a cross sectional view of providing a first substrate, and a buffer layer, a UV blocking layer, a plurality of light emitting diode crystal grains being sequentially formed on the first substrate in accordance with one exemplary embodiment.
Figure 3:
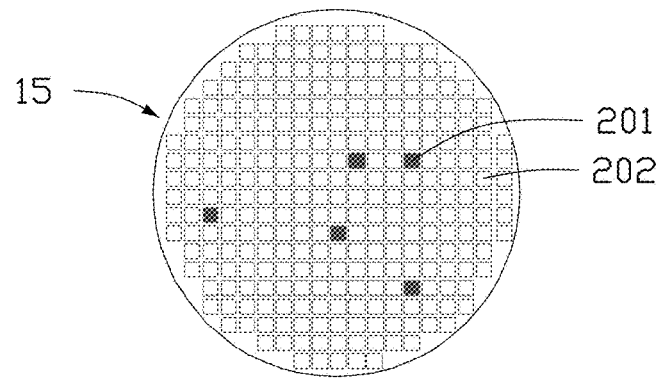
FIG. 3 is a top view of the substrate of FIG. 2.
Figure 4:
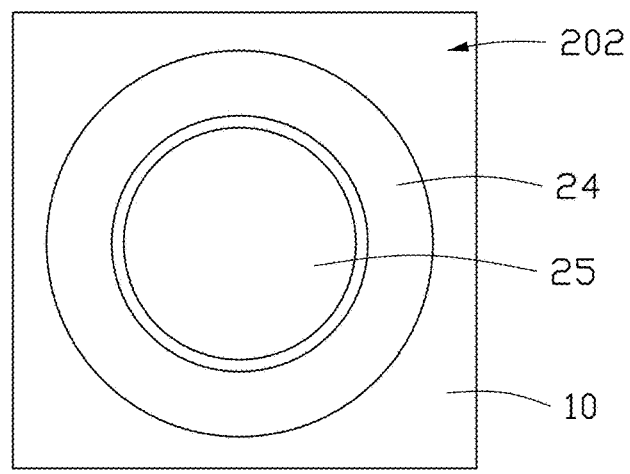
FIG. 4 is a top view of a single light emitting diode crystal grain on the substrate of FIG. 2.
Figure 5:
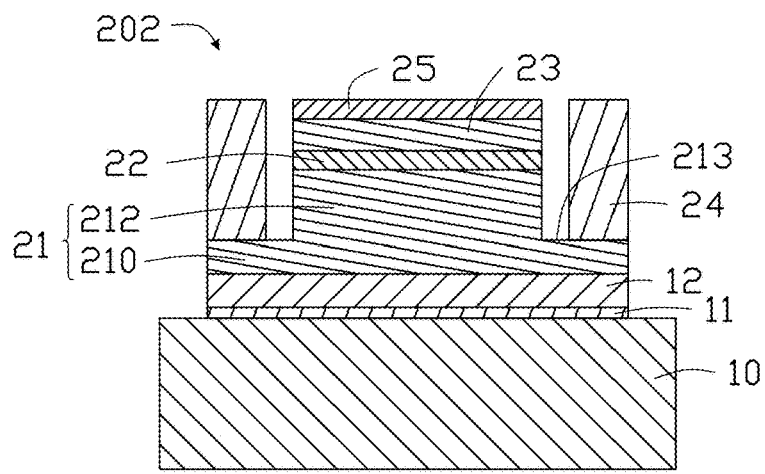
FIG. 5 is a cross sectional view of a single light emitting diode crystal grain.

At block 201, as shown in FIG. 2, a first substrate 10 is provided. The first substrate 10 includes a first surface 101 and a second surface 102 opposite to the first surface 101. In the illustrated embodiment, the first substrate 101 is a sapphire substrate.

At block 202, a buffer layer 11 is formed on the first surface 101. The buffer layer 11 is formed on the first substrate 10 using a metal organic chemical vapor deposition method. The buffer layer 11 is made from aluminum nitride or gallium nitride. A thickness of the buffer layer 11 is in a range from 10 nm to 50 nm, and in a preferred embodiment, a thickness of the buffer layer 11 is about 20 nm.

At block 203, a UV blocking layer 12 is formed on the buffer layer 11. A thickness of the UV blocking layer 12 is larger than a thickness of the buffer layer 11. The UV blocking layer 12 is configured to protect the adhesive layer 31 (shown in FIG. 9) from being overheated by the laser beam. The UV blocking layer 12 is formed on the buffer layer 11 using a metal organic chemical vapor deposition method. The UV blocking layer 12 is made from GaN or InGaAlN. A thickness of the UV blocking layer 12 is greater than or equal to 0.5 microns. In an illustrated embodiment, a thickness of the UV blocking layer 12 is in a range from 0.5 to 1 microns.

At block 204, as shown in FIGS. 1~4, a wafer 15 is formed on the UV blocking layer 12. The wafer 15 comprises a plurality of light emitting diode crystal grains 20. The wafer 15 is formed on the UV blocking layer 12 using a metal organic chemical vapor deposition method.

The light emitting diode crystal grain 20 includes a first semiconductor layer 21, an active layer 22, a second semiconductor layer 23, a first electrode 24, and a second electrode 25.

The first semiconductor layer 21 comprises a bottom portion 210 and a cylinder portion 212 protruding from the bottom portion 210. The bottom portion 210 and the cylinder portion 212 are substantially circular and coaxial. A diameter of the bottom portion 210 is larger than a diameter of the cylinder portion 212. A step portion 213 is formed between the bottom portion 210 and the cylinder portion 212.

The active layer 22, the second semiconductor layer 23, and the second electrode 25 are sequentially formed on the cylinder portion 212. The first electrode 24 is formed on the step portion 213 and spaced apart from the cylinder portion 212. In other embodiments, an insulating material can be infilled in the gap between the first electrode 24 and the cylinder portion 212, to ensure the first electrode 24 and the second electrode 25 are well insulated.

The first electrode 24 is a ring electrode surrounding the cylinder portion 212, the first electrode 24 and the second electrode 25 are coaxial. A height of the first electrode 24 equals a total height of the cylinder portion 212, the active layer 22, the second semiconductor layer 23, and the second electrode 25.

In the illustrated embodiment, the first electrode 24 is an N-type electrode, the first semiconductor layer 21 is an N-type semiconductor layer, the second electrode 25 is a P-type electrode, and the second semiconductor layer 23 is a P-type semiconductor layer.

Figure 6:
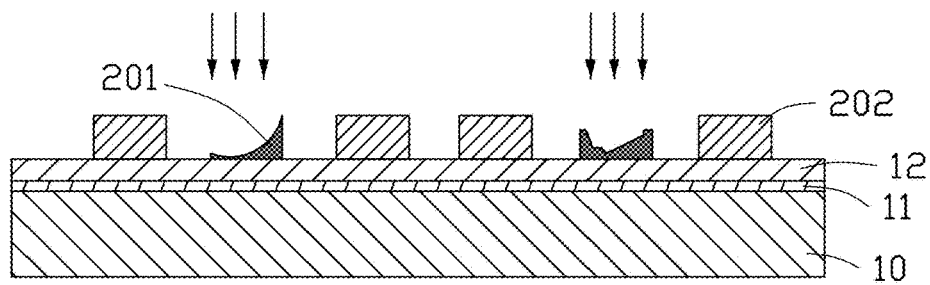
FIG. 6 is a cross sectional view of using laser beam to ablate bad light emitting diode micro grains.

At block 205, as shown in FIG. 6, the wafer 15 is analyzed, and light emitting diode micro grains 201 which are substandard (hereinafter: "substandard micro grains 201") are ablated using a laser beam. Ablation of substandard micro grains 201 is done by controlling the wavelength, frequency, distance, intensity, and focus range of the laser beam.

Figure 7:
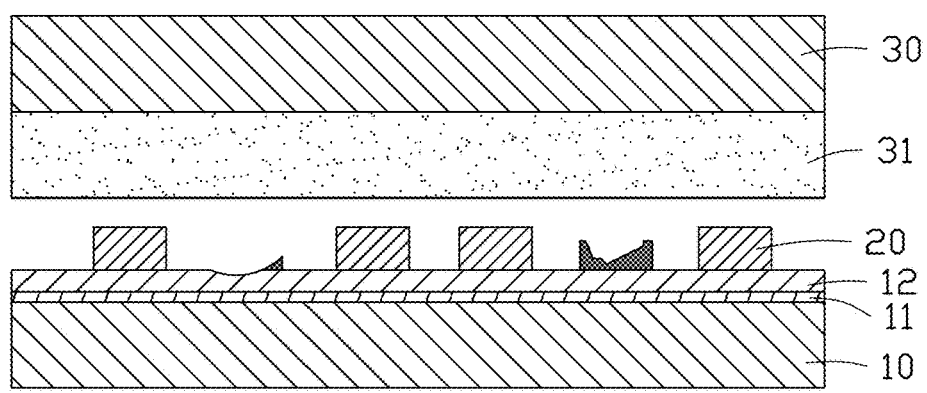
FIG. 7 is a cross sectional view of an auxiliary substrate provided with an adhesive layer.

At block 206, as shown in FIG. 7, an auxiliary substrate 30 is provided, and an adhesive layer 31 is formed on the auxiliary substrate 30. The auxiliary substrate 30 is made from glass, aluminum, or ceramic material. The adhesive layer 31 is selected from pyrogenic decomposition glue, cold decomposition glue, or chemical decomposition glue. In the illustrated embodiment, the adhesive layer 31 is epoxy resin, organic silicon, polymer, or wax.

Figure 8:
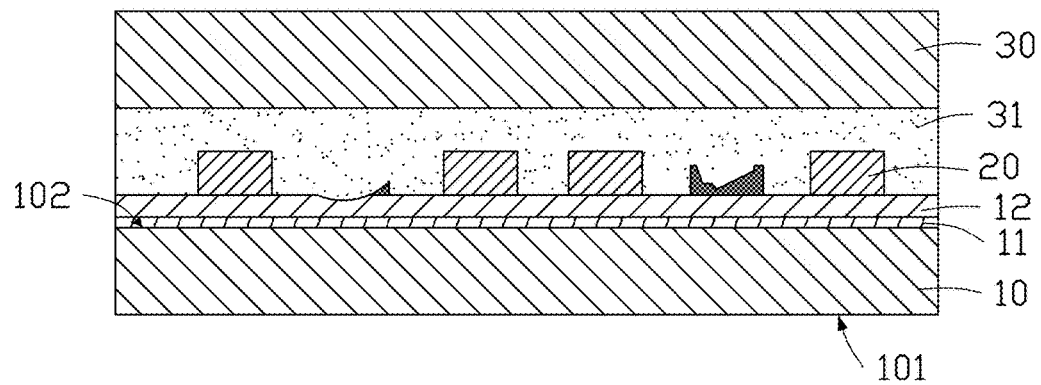
FIG. 8 is a cross sectional view of pressing the auxiliary substrate to the light emitting diode crystal grain.

At block 207, as shown in FIG. 8, the auxiliary substrate 30 with the adhesive layer 31 is pressed on the wafer 15, and solidifies the adhesive layer 31. The adhesive layer 31 also fills gaps between the light emitting diode crystal grains 20.

Figure 9:
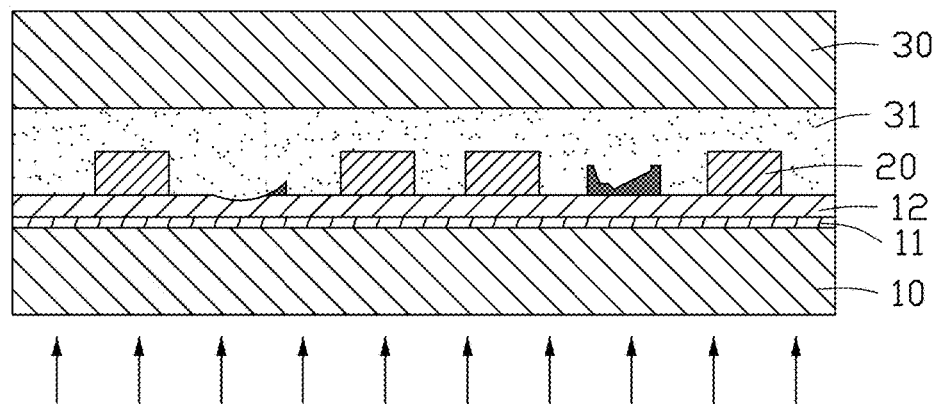
FIG. 9 is a cross sectional view of irradiating the substrate using a laser beam.
Figure 10:
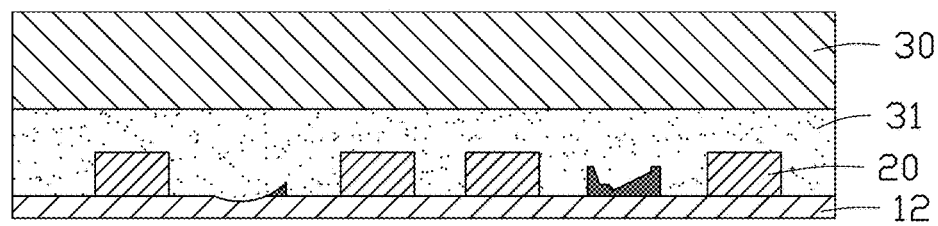
FIG. 10 is a cross sectional view of the buffer layer separated from the UV blocking layer using a laser beam.

At block 208, as shown in FIG. 9, irradiates the second surface 102 of the first substrate 10 to gasify the buffer layer 11, and separated the first substrate 10 from the UV blocking layer 12. In the illustrated embodiment, the buffer layer 11 is gasified under the irradiation of a laser beam, and the UV blocking layer 12 protects the adhesive layer 31 from being overheated by the laser beam, that is, avoid the adhesive layer 31 from coking by the irradiation of the laser beam, the UV blocking layer 12 is good for separating the light emitting diode crystal grain 20 from the adhesive layer 31 in the next step, thereby, the first substrate 10 is separated from the UV blocking layer 12, as shown in FIG. 10. The laser beam is a UV laser light, and a wavelength of the laser beam is about 355 nm or 266 nm.

Figure 11:
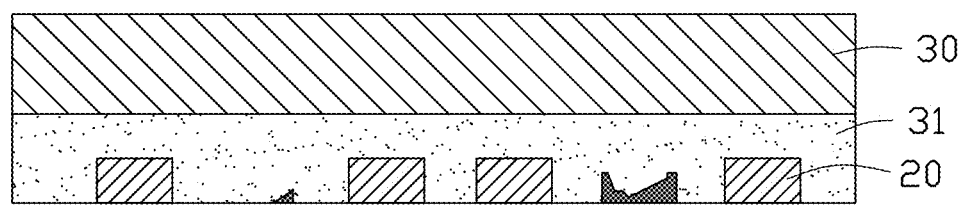
FIG. 11 is a cross sectional view of removing the UV blocking layer using an etching method.

At block 209, as shown in FIG. 11, the UV blocking layer 12 is etched and gradually removed from the adhesive layer 31, exposing parts of the surface of the light-emitting diode crystal grain 20.

Figure 12:
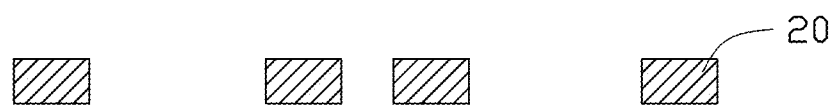
FIG. 12 is a cross sectional view of the adhesive layer dissolved to achieve a plurality of light-emitting diode micro grains.

At block 210, as shown in FIG. 12, the adhesive layer 31 is dissolved and a plurality of standard micro grains 202 of the light-emitting diode crystal grains 20 are obtained. In this embodiment, the adhesive layer 31 is chemical decomposition glue which can be dissolved using chemical solvents.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing light emitting diode crystal grain comprising:
    providing a first substrate, the first substrate comprising a first surface and a second surface opposite to the first surface;
    forming a buffer layer on the first surface;
    forming a UV blocking layer on the buffer layer, the UV blocking layer being made of GaN or InGaAlN;
    forming a wafer comprised of a plurality of light emitting diode crystal grains on the UV blocking layer;
    providing an auxiliary substrate and forming an adhesive layer on the auxiliary substrate;
    pressing the auxiliary substrate on the wafer and solidifying the adhesive layer, the adhesive layer filling gaps between the light emitting diode crystal grains;
    irradiating the second surface and gasifying the buffer layer, and separating the first substrate from the UV blocking layer;
    etching and removing the UV blocking layer from the adhesive layer; and
    dissolving the adhesive layer, thereby forming a plurality of light-emitting diode crystal grain.

2. The method for manufacturing light emitting diode crystal grain of claim 1, wherein before the step of providing the auxiliary substrate, and forming an adhesive layer on the auxiliary substrate, there comprises a step of detecting substandard light emitting diode micro grains in the wafer and ablating the substandard light emitting diode micro grains.

3. The method for manufacturing light emitting diode crystal grain of claim 2, wherein the UV blocking layer is formed on the buffer layer using a metal organic chemical vapor deposition method.

4. The method for manufacturing light emitting diode crystal grain of claim 1, wherein the auxiliary substrate is made from glass, aluminum or ceramic material.

5. The method for manufacturing light emitting diode crystal grain of claim 1, wherein the adhesive layer is selected from pyrogenic decomposition glue, cold decomposition glue or chemical decomposition glue.

6. The method for manufacturing light emitting diode crystal grain of claim 5, wherein the adhesive layer is pyrogenic decomposition glue, and the pyrogenic decomposition glue comprises epoxy resin or wax.

7. The method for manufacturing light emitting diode crystal grain of claim 6, wherein a thickness of the UV blocking layer is greater than or equal to 0.5 microns.

8. The method for manufacturing light emitting diode crystal grain of claim 7, wherein a thickness of the UV blocking layer is in a range from 0.5 to 1 microns.

9. The method for manufacturing light emitting diode crystal grain of claim 1, wherein the first substrate is a sapphire substrate, and the buffer layer is formed on the first substrate using a metal organic chemical vapor deposition method.

10. The method for manufacturing light emitting diode crystal grain of claim 1, wherein the buffer layer is made from aluminum nitride or gallium nitride.

11. The method for manufacturing light emitting diode crystal grain of claim 1, wherein a thickness of the UV blocking layer is larger than a thickness of the buffer layer.

12. The method for manufacturing light emitting diode crystal grain of claim 1, wherein the UV blocking layer is removed by etching.

13. The method for manufacturing light emitting diode crystal grain of claim 1, wherein the light emitting diode crystal grains are formed on the first substrate as the wafer using a metal organic chemical vapor deposition method.

14. The method for manufacturing light emitting diode crystal grain of claim 1, wherein the light emitting diode crystal grain comprises: a first semiconductor layer, an active layer, a second semiconductor layer, a first electrode and a second electrode; the first semiconductor layer comprises a bottom portion and a cylinder portion protruding from the bottom portion, the bottom portion and the cylinder portion are substantially circular and coaxial, a diameter of the bottom portion is larger than a diameter of the cylinder portion, a step portion is formed between the bottom portion and the cylinder portion; the active layer, the second semiconductor layer, and the second electrode are sequentially formed on the cylinder portion; and the first electrode is formed on the step portion and spaced apart with the cylinder portion.

15. The method for manufacturing light emitting diode crystal grain of claim 14, wherein the first electrode is a ring electrode surrounding the cylinder portion and the first electrode and the second electrode are coaxial.

16. The method for manufacturing light emitting diode crystal grain of claim 14, wherein a height of the first electrode equals a total height of the cylinder portion, the active layer, the second semiconductor layer and the second electrode.

* * * * *